(12) United States Patent
Stofiel

(10) Patent No.: US 7,093,815 B2
(45) Date of Patent: Aug. 22, 2006

(54) VIBRATION QUENCHING SUBSTRATE FOR DIAGNOSTIC EQUIPMENT SUSCEPTIBLE TO VIBRATIONS

(75) Inventor: Steven Patrick Stofiel, Stow, OH (US)

(73) Assignee: Hitachi Medical Systems America, Inc., Twinsburg, OH (US)

( * ) Notice: Subject to any disclaimer, the term of this patent is extended or adjusted under 35 U.S.C. 154(b) by 799 days.

(21) Appl. No.: 10/058,936

(22) Filed: Oct. 29, 2001

(65) Prior Publication Data
US 2003/0080742 A1    May 1, 2003

(51) Int. Cl.
  *F16M 13/00* (2006.01)
(52) U.S. Cl. ..................... 248/633; 248/679
(58) Field of Classification Search .............. 248/638, 248/678, 679, 621, 632, 633, 634, 559; 52/396, 52/463.1, 167.7, 144
See application file for complete search history.

(56) References Cited

U.S. PATENT DOCUMENTS

| | | | |
|---|---|---|---|
| 2,126,660 A | 8/1938 | Pogue | |
| 2,605,066 A | 7/1952 | Brown | |
| 3,499,255 A | 3/1970 | Sweeney et al. | |
| 3,828,504 A | 8/1974 | Egerborg et al. | ............. 52/396 |
| 3,944,181 A * | 3/1976 | Anthony | ................. 248/358 R |
| 4,436,274 A | 3/1984 | Kramer | ..................... 248/633 |
| 5,016,638 A | 5/1991 | Hsieh | ..................... 128/635 A |
| 5,129,232 A | 7/1992 | Minas et al. | ................. 62/51.1 |
| 5,277,010 A * | 1/1994 | Stephenson et al. | .......... 52/403 |
| 5,573,220 A | 11/1996 | Whittaker et al. | .......... 248/638 |

* cited by examiner

*Primary Examiner*—Gwendolyn Baxter
(74) *Attorney, Agent, or Firm*—Hudak, Shunk & Farine, Co. LPA

(57) ABSTRACT

A vibration quenching substrate which effectively isolates diagnostic equipment such as magnetic resonance imaging devices from image degrading vibrations. The substrate comprises numerous layers including a base layer, an elastomeric layer, and an inertia base layer which free-floats on the elastomeric layer. Importantly, the elastomeric layer is free of any rigid connection to either the base or inertia base layers.

24 Claims, 2 Drawing Sheets

VIBRATION QUENCHING SUBSTRATE FOR DIAGNOSTIC EQUIPMENT SUSCEPTIBLE TO VIBRATIONS

FIELD OF THE INVENTION

The present invention relates to a vibration dampening and/or quenching substrate comprising numerous layers which provides an effective means for reducing and even eliminating vibrations from various transmitting or propagating sources. The vibration quenching substrate comprises a free-floating pad and can advantageously be utilized as a support for medical diagnostic devices or machines thereby substantially completely isolating the same from a vibration transmitting source.

BACKGROUND OF THE INVENTION

It has been found that diagnostic medical imaging equipment, such as magnetic resonance imaging (MRI) devices, are sensitive to mechanical or natural vibrations from external sources. The vibrations are generally transmitted to the device through the base upon which the imaging device is situated.

Numerous external sources of vibration have been identified. Generally, diagnostic equipment is located in hospitals or other healthcare sites situated near major roads or highways and developed areas wherein road traffic comprising automobiles, buses, trucks and even trains have been noted for causing harmful vibrations. Other such vibration producing sources within healthcare sites include but are not limited to mechanical and hydraulic elevators, heating ventilating and air conditioning systems (HVAC), air compressors, extractor fans and water and vacuum pumps.

Generally, the vibrations transmitted to diagnostic equipment result in degraded and reduced quality images at least in the form of snowy, blurred or replicated images. Since the preferred magnet is an open type and not the tunnel or sewer pipe, it is theorized that the North and South Pole relationship actually changes. This causes a fluctuation in the magnetic field purity. This purity is specified in PPM (part per million). The preferred MRI device of the present invention has a specification of 3 PPM and any disturbance greater than about 0.03 PPM will cause image artifacts which are recorded by the MRI Imager.

Prior to the present invention, there have been numerous attempts to reduce vibrations, noise, impulses or shocks both to and from various machines.

U.S. Pat. No. 2,126,660 to Pogue relates to apparatus reportedly used for preventing the vibrations of an engine or machine from being transmitted to the building or structure within which or upon which the engine or machine is installed, and particularly, anti-vibration-supporting apparatus of the type that employ springs for taking up or absorbing the vibrations of the engine or machine.

U.S. Pat. No. 2,605,066 to Brown relates to machinery supports for heavy, impact generating machines, such as forging machines, wherein the vibration from the machines to surrounding surfaces is limited.

U.S. Pat. No. 3,499,255 to Sweeney et al. relates to a vibration isolation floor construction for supporting vibration sensitive and vibration producing machines, equipment and the like. The floors comprise pads of glass fiber material which are formed so as to maintain constant natural frequencies under variations in loading. In particular, the floor constructions are constructed and loaded in accordance with fabricated isolation pads. In addition, the floor constructions can be fabricated in accordance with a formula which has been established to provide the above-mentioned advantages.

U.S. Pat. No. 4,436,274 to Kramer relates to a laminated vibration isolation pad comprising first or top rigid layer of ultra-high molecular weight polyethylene material, a second layer of vulcanized elastomeric material with an additional third or bottom layer of spaced resilient vulcanized elastomeric projections. The laminated vibration isolation pad is fabricated as a unitary structure with the polyethylene layer bonded or fused to the rubber layer while being formed.

U.S. Pat. No. 5,016,638 to Hsieh relates to a medical NMR scanner adapted to be supported on the floor of a building or other structure by vibration limiting supports. The scanner includes a frame defining a patient-receiving space adapted to receive a human body. It also includes a pair of opposed polar regions aligned on a polar axis. The polar regions are disposed on opposite sides of the patient-receiving space. Structure is provided in each of the polar regions for producing a magnetic field within the patient-receiving space. Attenuators, positioned intermediate the frame and the building floor, are provided for reportedly attenuating transmission of vibrations from the floor to the magnetic field producing structure in order to reduce scanner image degradation.

U.S. Pat. No. 5,573,220 to Whittaker et al. relates to a reportedly vibration absorbing and leveling machinery foundation mount and a method for tuning the same, the mount consisting of a rigid horizontal platform having a plurality of vibration absorbing legs. A leveler is mounted in the central region of the platform having a vertically adjustable riser, and the legs are formed by pockets housing a composite vibration absorbing material extending below the platform and engaging the surface upon which the machinery mount is supported which may be tuned to most effectively absorb the vibration to which the mount is subjected.

SUMMARY OF THE INVENTION

The present invention discloses a vibration dampening and/or quenching substrate which effectively isolates diagnostic equipment, preferably a magnetic resonance imaging device from image degrading vibrations. Importantly, the diagnostic equipment is free-floated on the vibration dampening and/or quenching substrate to allow maximum vibration suppression. The substrate comprises a plurality of layers including an elastomeric isolator layer which isolates diagnostic equipment from vibrational interference. The materials used to construct the substrate are chosen so they do not interfere with or alter the static magnetic field generated by the magnet of the diagnostic device.

Other advantages and features of the invention will be apparent from the following description of a preferred embodiment and from the claims.

BRIEF DESCRIPTION OF THE DRAWINGS

The invention will be better understood and other features and advantages will become apparent by reading the detailed description of the invention, taken together with the drawings wherein:

FIG. 4 is a slightly elevated side view of an individual isolator.

DETAILED DESCRIPTION OF THE INVENTION

The vibration dampening and/or quenching substrate of the present invention is described in detail hereinbelow wherein the preferred embodiment has been set forth. Making reference now to the drawings wherein like reference numbers represent the same or corresponding parts throughout the several figures, there is illustrated in FIG. 1 a preferred embodiment of the substrate 10 of the present invention which has been designed to substantially reduce quench vibrations from external sources.

Figure 1:
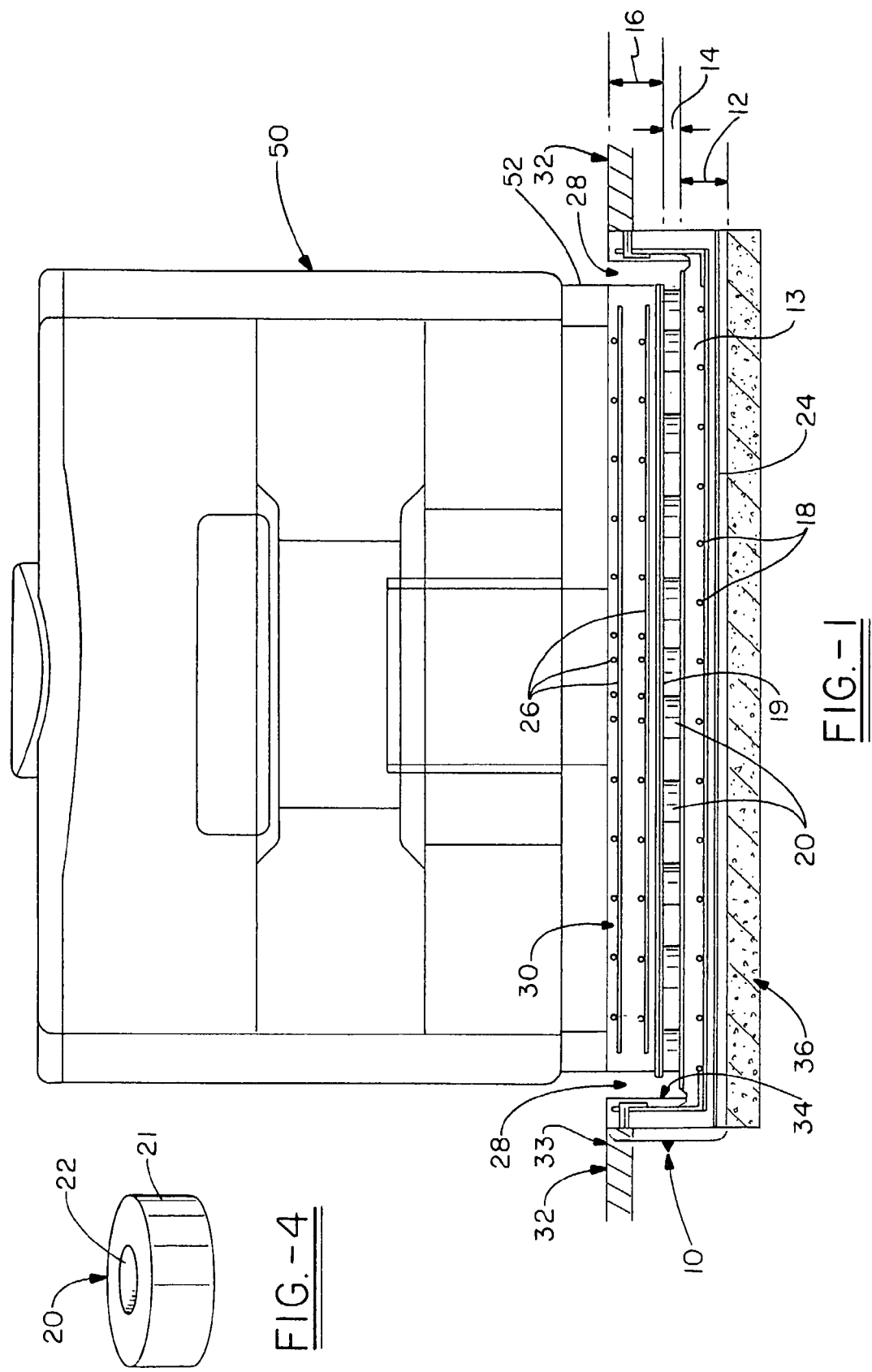
FIG. 1 is a side elevation view of a vibration quenching substrate taken in cross section in accordance with a preferred embodiment of this invention.

In FIG. 1, substrate 10 is shown located in a cavity, pit or depression 30 of a floor 32 at a facility such as a healthcare site or hospital. The floor 32 can be of any construction with concrete being the most common. Floor 32 has an upper surface 33 and side surfaces 34 in the area of cavity 30 which are generally vertical or substantially vertical.

Typically, the diagnostic equipment or MRI devices supported and isolated by the substrate are quite massive and weigh in a range generally from about 50,000 to about 150,000 pounds and preferably from about 75,000 to about 125,000 pounds. Thus, the devices are frequently situated on the ground floor of the desired site. A cavity 30 is typically formed by cutting away or removing the existing substrate, e.g., concrete. The exposed subgrade or earth layer, i.e. topsoil, clay, rock, or the like is preferably compacted and leveled. The subgrade is compacted to generally at least 50%, desirably at least 75% or 85%, and preferably at least 95% of maximum density as measured by ASTM D 1567.

The exposed subgrade is covered with engineered fill or crushed fill 36 such as limestone as shown in FIG. 1. The size of the fill can vary and include fines. Fill 36 is preferably compacted to at least 50%, desirably at least 75%, and preferably at least 95% of maximum dry density as determined by the modified proctor test ASTM D 1557. The depth of the fill is sufficient to allow a bearing capacity of at least generally 2,000 pounds per square foot, desirably at least 2,500 or 2,750 pounds per square foot, and preferably at least 3,000 pounds per square foot. The depth of fill 36 ranges generally from about 2 to about 21 inches, desirably from about 3 to about 12 inches, and preferably from about 4 to about 8 inches.

In the preferred embodiment, the depth of the cavity is such that the desired piece or pieces of diagnostic equipment, such a an MRI device 50, has a base 52 which is substantially level with the floor upper surface 33 as shown in FIG. 1 when placed on the vibration dampening and/or quenching substrate 10 of the present invention. It should be obvious to one of ordinary skill in the art the depth of the cavity 30 can vary or even be absent depending on the aesthetic or functional desire of the site planner. That is, the vibration quenching substrate can be installed above grade, but it is generally not desirable because of the height of the magnets of the MRI device.

As shown in FIG. 1, the vibration quenching substrate comprises numerous layers including a lower or base layer 12, an elastomeric layer 14, and an inertia base layer 16 which floats or resides on the elastomeric layer.

The bottom or base layer 12 provides an interface between the substrate 10 and surrounding floor 32 and cavity 30. To insure maximum vibration dampening or reduction, only the base layer is connected to the peripheral floor structure and the remaining layers of the substrate are free of any physical connection thereto. In order to support the immense weight of the preferred MRI device, the base layer in the area of cavity 30 comprises generally from about 8 or 12 to about 24 or 30, and preferably from about 14 to about 18 or 20 inches of concrete 13. The concrete 13 is reinforced with non-ferrous or non-magnetic rebar 18, for example fiberglass rebar, so that there can be no interference with the MRI device. Steel or other rebar having magnetic properties will degrade the purity of static (main) field. The base layer includes a radio frequency (RF) shield such as copper sheeting in order to block radio transmission interference which can result in degraded images having streaks or lines. Desirably the radio frequency (RF) shield is located in base layer 12 about 4 inches below the upper surface of the concrete 13.

The base layer 12, including rebar and radio frequency (RF) shield, is preferably bonded or otherwise connected to the surrounding floor 32. For example, the rebar can be tied into existing rebar from floor 32 and base layer concrete can be bonded to the existing concrete as shown in FIG. 1. In an alternative embodiment, holes or apertures can be drilled in the existing concrete surface and the non-magnetic rebar can be epoxied into the hole with an epoxy which exceeds the bond strength of the concrete.

The concrete utilized in base layer 12 must have a minimum strength of at least 3,000 and preferably at least 4,000 psi (pounds per square inch) after a cure time of 28 days.

As shown in FIG. 1, elastomeric layer 14 is located above base layer 12. Elastomeric layer 14 comprises numerous individual and separated vibration dampening isolators 20. The isolators are composed of a resilient elastomeric material having excellent vibration dampening properties. Each isolator preferably is a single piece molded elastomer. As utilized in the present invention, the term "elastomer" refers to both rubbers and plastics which optionally can be crosslinked. Rubbers include natural rubber, rubber made from straight chain or branched dienes having from 4 to about 12 carbon atoms and optionally vinyl containing aromatics having from 8 to 12 carbon atoms such as styrene, neoprene, nitrile rubber, butyl rubber, ethylene-propylene-diene terpolymers (EPDM), silicone rubbers, polyurethane rubbers, and copolymers thereof. Plastics are generally uncrosslinked, and include but are not limited to, polyolefins having from 2 to about 20 carbon atoms such as ethylene and propylene and copolymers thereof.

Importantly, the isolators 20 of the elastomeric layer are free of any fixed connection, attachment, or any other bond to either the lower layer 12 or inertia base layer 16 whereby the physical integrity of isolator is compromised. That is, it has been found by the applicant, in order to maximize efficiency of the isolators and provide the necessary vibration quenching or dampening properties to the associated MRI device or other piece of diagnostic equipment, the elastomeric layer cannot be fixedly connected to any other layer, by for example, but not limited to screws, bolts, or nuts. Screws, bolts or other like materials interfere with the vibration absorbing properties of isolators and tend to transfer the vibration through the isolator. Furthermore, each isolator is free of any direct connection to other isolators to further enhance vibration absorbing properties.

The individual isolators 20 can generally be of any desired shape or size. Preferably, as shown in FIG. 4, the isolator 20 is formed in the shape of an annulus or cylinder, optionally having a central area 22 or aperture which is free of elastomeric material 21, described hereinabove. The preferred isolator has a height which ranges generally from about 2 to about 6 inches, desirably from about 3 to about 4 inches and preferably is about 3.5 inches (before bearing a load). The isolator has an inside diameter generally from about 0.25 or 1 to about 4.25 or 4.5 inches, desirably from about 2.5 to about 4 inches, and preferably about 3.5 inches, and an outside diameter generally from about 4.5 to about 8 inches, desirably from about 5 to about 7 inches, and preferably is about 6.5 inches. The isolators are spaced at increments to effectively support and distribute the weight of the diagnostic medical imaging equipment. The preferred isolator is commercially available from Kinetics Noise Control, 6300 Irelan Place, Dublin, Ohio 43017 as KPM isolators.

Inertia base layer 16, as shown in FIG. 1, resides upon elastomeric layer 14. The inertia base layer comprises a pad of concrete generally from about 2 to about 24, and preferably from about 4 to about 12 inches thick. The concrete is preferably reinforced with rebar 26, wire mesh or the like which is non-magnetic and does not interfere with operation of the MRI device. Optionally, the inertia base can include a layer of plywood 19 upon which the concrete can be formed.

Figure 2:
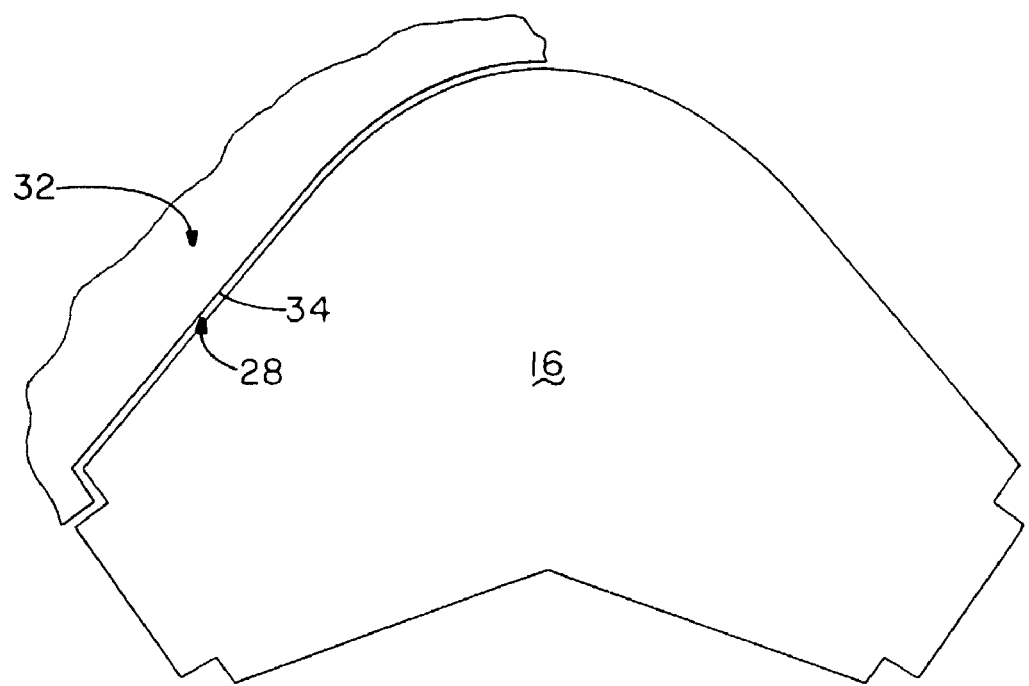
FIG. 2 is a top view of the inertia base layer, wherein it is shown that the inertia base layer is free from any connection to the surrounding floor surfaces.
Figure 3:
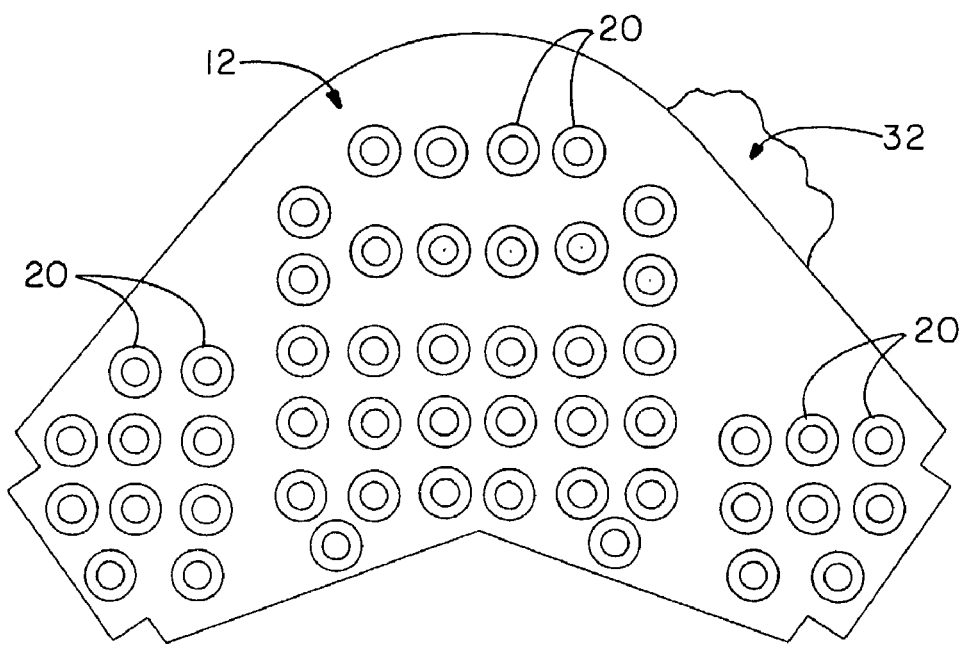
FIG. 3 is a top view of the elastomeric layer comprising numerous individual isolators at spaced increments sufficient to support the diagnostic device and provide the requisite vibration dampening.

As shown in FIG. 2, the inertia base layer is free of any direct connection to the surrounding surfaces of floor 32 through air gap 28, thereby further isolating the inertia base from vibrations. The inertia base 16 freely floats or rests on the elastomeric layer and is isolated from the surrounding surfaces thereby. As shown in FIG. 2, the inertia base 16 is shaped to coincide with the base profile or contour of the MRI device. As is obvious to one of ordinary skill in the art, the dimensional shape of the inertia base layer can be modified to mimic or be larger or smaller than the profile of any desired piece of diagnostic equipment.

As apparent from the foregoing description, the diagnostic equipment will be isolated from vibrations from sources external to the vibration reducing substrate, i.e. thereby substantially eliminating image degradation associated with vibration.

Although the preferred form for the vibration quenching substrate has been illustrated hereinabove, various modifications and changes in materials and arrangements of parts may obviously be made by those skilled in the art without departing from the principles and scope of the invention.

While in accordance with the patent statutes the best mode and preferred embodiment have been set forth, the scope of the invention is not limited thereto, but rather by the scope of the attached claims.

What is claimed is:

1. A vibration reducing substrate for a medical diagnostic device, the substrate comprising:
    an inertia base layer which is adapted to support said medical diagnostic device;
    an elastomeric layer, said inertia base layer freely floating on said elastomeric layer so that said inertia base layer is free of any direct connection to a surrounding floor; and
    a base layer, said elastomeric layer residing on said base layer, and wherein said base layer is reinforced with non-ferrous or non magnetic rebar.

2. A vibration reducing substrate according to claim 1, wherein said elastomeric layer comprises a plurality of individual isolators.

3. A vibration reducing substrate according to claim 2, wherein said isolator is a cylinder having a hollow central area.

4. A vibration reducing substrate according to claim 2, wherein said isolator comprises natural rubber, silicone rubber, polyurethane rubber, nitrile rubber, butyl rubber, ethylene-propylene-diene terpolymers (EPDM), straight chain or branched diene monomers having from 4 to about 12 carbon atoms, vinyl containing aromatic monomers having from 8 to about 12 carbon atoms, polyolefins having from 2 to about 20 carbon atoms, or copolymers thereof.

5. A vibration reducing substrate according to claim 4, wherein said inertia base layer comprises a pad of concrete and wherein said inertia base layer concrete is reinforced with non magnetic rebar.

6. A vibration reducing substrate according to claim 5, wherein said inertia base layer has a shape adapted to substantially correspond to a base profile of said medical diagnostic device.

7. A vibration reducing substrate according to claim 6, wherein each isolator is a single piece elastomer, and wherein each isolator has a height which ranges from about 2 to about 6 inches, wherein each isolator is in the shape of an annulus having a central area free of elastomeric material, and wherein said isolator has an inside diameter from 0.25 to about 4.25 inches and an outside diameter from about 4.5 to about 8 inches.

8. A vibration reducing substrate according to claim 1, wherein said inertia base layer has a top surface which is adapted to be substantially level with a surface of the surrounding floor.

9. A vibration reducing substrate according to claim 1, wherein said base layer comprises from about 8 to about 30 inches of concrete, and wherein said base layer includes a radio frequency (RF) shield layer extending completely through the length and width of said base layer.

10. A substrate to reduce vibration transmissions from surrounding surfaces to a medical diagnostic device, said substrate comprising:
    a base layer, wherein said base layer includes a radio frequency (RF) shield layer extending through the length and width of said base layer;
    an elastomeric layer located on said base layer; and
    an inertia base layer residing on said elastomeric layer, said inertia base layer adapted to support a medical diagnostic device, said elastomeric layer being free of a fixed connection to said base layer and said inertia base layer.

11. A substrate according to claim 10, wherein said elastomeric layer comprises a plurality of individual spaced isolators each having a first surface contacting the base layer and a second opposite surface contacting the inertia base layer.

12. A substrate according to claim 11, wherein said base layer comprises from about 8 to about 30 inches of concrete, and wherein said base layer is reinforced with non-ferrous or non magnetic rebar.

13. A substrate according to claim 10, wherein said inertia base layer has a top surface which is adapted to be substantially level with a surface of the surrounding floor.

14. A substrate according to claim 10, wherein said isolator comprises natural rubber, silicone rubber, polyurethane rubber, nitrile rubber, butyl rubber, ethylene-propylene-diene terpolymers (EPDM), straight chain or branched diene monomers having from 4 to about 12 carbon atoms, vinyl containing aromatic monomers having from 8 to about 12 carbon atoms, polyolefins having from 2 to about 20 carbon atoms, or copolymers thereof.

15. A substrate according to claim 14, wherein said inertia base layer comprises a pad of concrete and wherein said concrete is reinforced with non magnetic rebar.

16. A substrate according to claim 15, wherein each isolator is a single piece elastomer, and wherein each isolator has a height which ranges from about 2 to about 6 inches, wherein each isolator is in the shape of an annulus having a central area free of elastomeric material, and wherein said isolator has an inside diameter from 0.25 to about 4.25 inches and an outside diameter from about 4.5 to about 8 inches.

17. A substrate according to claim 10, wherein said isolator is a cylinder having a hollow central area.

18. A substrate according to claim 10, wherein said inertia base layer has a shape adapted to substantially correspond to a base outline of said medical diagnostic device.

19. A vibration reducing substrate, comprising:
an inertia base layer which is adapted to support a device;
a plurality of elastomeric isolators; and
a base layer, said plurality of isolators each having a first surface contacting the inertia base layer and a second opposite surface residing on the base layer, wherein each isolator is spaced a predetermined distance and free of any direct elastomeric connection from the remaining isolators, wherein said isolators are free of any fixed connection to said base layer and said inertia base layer wherein said inertia base layer is free of any direct connection to a surrounding floor, and wherein the base layer includes non-magnetic rebar.

20. A substrate according to claim 19, wherein the base layer and the inertia base layer comprise concrete.

21. A substrate according to claim 20, wherein said isolator comprises natural rubber, silicone rubber, polyurethane rubber, nitrile rubber, butyl rubber, ethylene-propylene-diene terpolymers (EPDM), straight chain or branched diene monomers having from 4 to about 12 carbon atoms, vinyl containing aromatic monomers having from 8 to about 12 carbon atoms, polyolefins having from 2 to about 20 carbon atoms, or copolymers thereof.

22. A substrate according to claim 21, wherein the base layer concrete is from about 8 to about 24 inches thick and the inertia base layer concrete ranges from about 2 to about 24 inches thick, and wherein each isolator has a height which ranges from about 2 to about 6 inches.

23. A substrate according to claim 22, wherein the base layer concrete is from about 4 to about 12 inches thick and the inertia base layer concrete ranges from about 8 to about 18 inches thick, and wherein each isolator has a height which ranges from about 3 to about 4 inches.

24. A substrate according to claim 23, wherein the base layer includes a radio frequency (RF) shield.

* * * * *